RADAR DEVICE WITH FREQUENCY MODULATION AND SPECTRAL COMPRESSION OF THE INTERMEDIATE-FREQUENCY SIGNAL
Filed March 15, 1968
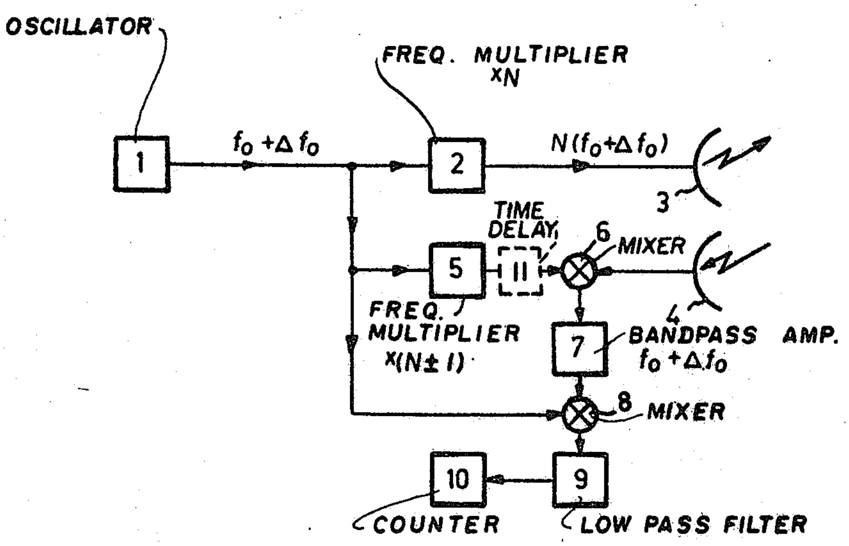
INVENTORS
PIERRE BONNAVAL
JEAN P. FOUILLOY
BY
Frank R. Trifari
AGENT United States Patent Office 3,493,969

Patented Feb. 3, 1970

3,493,969

RADAR DEVICE WITH FREQUENCY MODULATION AND SPECTRAL COMPRESSION OF THE INTERMEDIATE-FREQUENCY SIGNAL

Pierre Bonnaval, Meudon, and Jean Pierre Fouilloy, Velizy, France, assignors, by mesne assignments, to U.S. Philips Corporation, New York, N.Y., a corporation of Delaware Filed Mar. 15, 1968, Ser. No. 713,394
Claims priority, application France, Mar. 16, 1967, 99,025
Int. Cl. G01s 9/23, 9/24
U.S. Cl. 343—17.5 3 Claims

ABSTRACT OF THE DISCLOSURE

A frequency modulated continuous emission radar system in which common oscillations are multiplied by a factor $n$ for transmission and by a factor $n\pm1$ for mixing with received signals. The received signals, after mixing, are amplified in an amplifier having a bandpass equal to the frequency variation of the oscillator, and then are mixed in a second mixer with the common oscillations.

This invention relates to a continuously-emitting radio device with frequency modulation and superheterodyne reception.

Radar devices of this kind are known, per se. An oscillator linearly modulated in frequency continuously emits waves which are reflected by the obstacle. Furthermore, the signal produced by a local oscillator having a fixed frequency is mixed with the signal provided by the said modulated oscillator so as to obtain a beat wave between the modulated frequency and the fixed frequency at the output of the mixing element. The signal emitted by the local oscillator of fixed frequency is also mixed with the reflected wave. The output signals from the said mixing elements are applied to bandpass amplifiers, the output signals of which are fed to a mixing element followed by a lowpass filter. The output signal from the lowpass filter is dealt with in a counter which is, for example, directly calibrated in distances.

When considering a device having resolving power at long distance, it is known that this power depends substantially upon the spectral width of the signal being emitted.

The order of magnitude of the various parameters of such a device could be as follows:

Emission frequency in the absence of modulation: 4,300 mc./s.
Frequency sweep: 200 mc./s.
Period of the modulating signal T=100 msec.

The bandpass amplifiers referred to will have to be adjusted to a high frequency, for example, 400 mc./s., and need a "flat" passband, that is to say free from distortion, of 200 mc./s. and this for a gain of from 40 to 60 db. With the actual state of the art it is difficult to manufacture such amplifiers.

It is one object of the invention considerably to simplify these bandpass amplifiers by compressing the spectrum of the signals passing through the device, without any loss of useful information.

Another object is to suppress the local oscillator of fixed frequency and replace it by the emission oscillator itself.

It is known that the emission frequencies of radar systems are usually very high and located in the region of ultra-high frequencies (between 3 gc./s. and 30 gc./s.). With the actual state of the art these ultra-high frequencies are produced by frequency multiplication with the aid of a generator of harmonics, for example, of the semiconductor type. The present invention relates more particularly to a radar device in which the ultra-high frequencies are produced by "multiplication."

The device according to the invention comprising an oscillator producing a frequency $f_0$ and means of imparting to it a linear frequency sweep $\Delta f_0$, this modulated frequency being transmitted to a radiating member through an element multiplying the frequency by $n$, is characterized substantially in that it comprises for the reception a mixing circuit constituted by a mixing element fed on the one hand by the reflected wave caught by an aerial and, on the other hand, by the said modulated frequency $f_0$ after having passed through an element multiplying the frequency by $(n\pm1)$, followed by an amplifying element the minimum passband of which is equal to the frequency sweep $\Delta f_0$, and a second mixing element providing a beat frequency between the modulated frequency $f_0$ and the signal emitted by the amplifying element, the output signal from said mixing element passing through a lowpass filter before being applied to the consuming device.

In order that the invention may be readily carried into effect, it will now be described in detail, by way of example, with reference to the accompanying diagrammatic drawings.

The sole figure shows a block diagram of the device according to the invention.

An oscillator 1 produces a frequency $f_0$. This frequency $f_0$ may be given a linear frequency sweep $\Delta f_0$ by means of a sawtooth signal of period T applied to the said oscillator.

The waveform, as a function of time, of the output signal from the oscillator 1 is over the period T:

$$v_0(t)=\cos 2\pi\left[f_0 t+\frac{\Delta f_0 t^2}{2T}\right]$$

This signal is applied to an element 2 multiplying the frequency by $n$.

The signal transmitted to the radiating member 3 thus has the form:

$$S_0(t)=\cos 2\pi\left[nf_0 t+\frac{n\Delta f_0 t^2}{2T}\right]$$

It will be seen that the carrier frequency has become $nf_0=F_0$ and the frequency sweep $n\Delta f_0=\Delta F_0$. The reflected wave is received by means of an aerial 4. The signal being caught is of the form:

$$AS_0(t-\tau)$$

A being the attenuation of the transmission and $\tau$ the retardation of the reflected wave relative to the emitted wave.

Furthermore, an element 5 multiplying the frequency by $(n-1)$, to which the signal from oscillator 1 is applied, provides a signal $$S_1(t)=\cos 2\pi\left[(n-1)f_0 t+\frac{(n-1)f_0 t^2}{2T}\right]$$

The signals $S_1(t)$ and $AS_1(t-\tau)$ are fed to a mixing element 6 which is followed by a bandpass amplifying element 7 adjusted to $f_0$ and having a minimum passband which is equal to the frequency sweep $\Delta f_0$.

If $\tau<<T$, as is usually the case, the signal received at the output of bandpass amplifier 7 has the form:

$$v_0(t,\tau)=A\cos 2\pi\left[f_0 t+\frac{\Delta f_0 t^2}{2\pi}-nf_0\tau-\frac{n\Delta f_0\tau t}{T}\right]$$

This signal is mixed with the signal from oscillator 1 in mixing element 8.

The output from 8 is connected to a lowpass filter 9 which provides a signal of the form:

$$W(t,\tau)=A\cos 2\pi\left[nf_0\tau+\frac{\pi\Delta f_0\tau t}{T}\right]$$

which signal is dealt with an element 10, for example, a counter directly calibrated in distance.

The advantage afforded by the device is evident: the bandpass amplifier 7 adjusted to $f_0$ must have a minimum passband $\Delta f_0$ and no longer $$n\Delta f_0=\Delta F_0$$

as in earlier devices. The spectrum of the incoming signal has been compressed in a ratio $n$ without any loss of useful information. An amplifier of the kind such as 7 is much easier to manufacture and, as previously mentioned, the emission oscillator has become its own local oscillator (after multiplication by $n\pm 1$).

Using the data given hereinbefore, one would have with the device of the invention;

$f_0=134.375$ mc./s.: $n=32$; $F_0=nf_0=4.300$ mc./s.;
$\Delta f_0=6.25$ mc./s.; $\Delta F_0=n\Delta f=nf=200$ mc./s.;
T=10 msec.; $o\leq\tau\leq 100\mu$ sec.

The bandpass amplifier 7 is adjusted to 134.375 mc./s. and has a passband of 6.25 mc./s. (instead of 200 mc./s.).

The embodiment of the invention described hereinbefore has been given purely by way of example and it will be evident that numerous modifications or variants thereof are possible without passing beyond the scope of the invention. Notably if it is desired to obtain a radar device with correlation reception, the invention lends itself particularly well to this operation. It is known that the correlation of two signals consists in multiplication of the one signal by the other, further in filtration or integration of the product obtained. The object of this operation is considerably to improve the signal-to-noise ratio, from which results its evident interest in the domain of radar.

In a radar device with correlation reception, the emitted signal is artificially delayed before being multiplied by the received signal, this delay being equal to the delay experienced by the received signal and which corresponds to a given distance from the object. A signal of great amplitude will thus be obtained at the output of the element causing the correlation only in the case that the object actually finds itself at this distance.

As previously mentioned, a radar device emits in the region of ultra-high frequencies and it is very difficult to delay such waves. In the device according to the present invention such an operation becomes very easy, since the delay line 11 (represented by a block shown in dotted line) operates at the frequency $f_0$, which is comparatively low.

What is claimed is:

1. A radar system for detecting a target cimprising a source of continuous oscillations of frequency $f_0$ having a frequency sweep $\Delta f_0$, first frequency multiplier means connected to multiply said oscillations by a first factor $n$, means for transmitting the output of said first multiplier means, means for receiving echo signals from the target, second frequency multiplier means for multiplying said oscillations by a factor equal to $n\pm 1$, first means for mixing said echo signals and the output of said second multiplying means, bandpass amplifier means having a passband of substantially $\Delta f_0$ at a frequency of $f_0$ connected to amplify the output of said mixing means, and second means for mixing the output of said amplifier means with said oscillations to produce a low frequency output signal.

2. A radar device as claimed in claim 1, further comprising means for correlating the emitted signals and received signals including a time delay element between the oscillator producing the frequency $f_0$ and said second mixing means.

3. A device as claimed in claim 1 wherein said frequency sweep is linear.

References Cited

UNITED STATES PATENTS 3,080,558 3/1963 Rust ---------------- 343—14
3,382,497 5/1968 Cooley ------------ 343—14 X RODNEY D. BENNETT, Jr., Primary Examiner JEFFREY P. MORRIS, Assistant Examiner